(12) United States Patent
Hilton et al.

(10) Patent No.: US 6,762,509 B2
(45) Date of Patent: Jul. 13, 2004

(54) FLIP-CHIP PACKAGING METHOD THAT TREATS AN INTERCONNECT SUBSTRATE TO CONTROL STRESS CREATED AT EDGES OF FILL MATERIAL

(75) Inventors: Robert M. Hilton, Burpengary (AU); Sabran B. Samsuri, Penang (MY)

(73) Assignees: Celerity Research Pte. Ltd., Singapore (SG); ASE Electronics (M) Sdn. Bhd., Penang (MY)

( * ) Notice: Subject to any disclaimer, the term of this patent is extended or adjusted under 35 U.S.C. 154(b) by 67 days.

(21) Appl. No.: 09/683,303

(22) Filed: Dec. 11, 2001

(65) Prior Publication Data

US 2002/0060084 A1 May 23, 2002

(51) Int. Cl.⁷ ............................................... H01L 23/29
(52) U.S. Cl. ........................................ 257/787; 257/789
(58) Field of Search .............................. 257/787, 789, 257/783, 777, 729, 723, 706, 696, 684, 507, 667, 778, 704; 438/106, 108

(56) References Cited

U.S. PATENT DOCUMENTS

| | | | | |
|---|---|---|---|---|
| 5,120,678 A | * | 6/1992 | Moore et al. | 437/183 |
| 5,336,931 A | * | 8/1994 | Juskey et al. | 257/787 |
| 5,450,283 A | * | 9/1995 | Lin et al. | 361/704 |
| 5,541,450 A | * | 7/1996 | Jones et al. | 257/697 |
| 5,583,378 A | * | 12/1996 | Marrs et al. | 257/710 |
| 5,646,828 A | * | 7/1997 | Degani et al. | 361/715 |
| 5,674,785 A | * | 10/1997 | Akram et al. | 438/15 |
| 5,739,585 A | * | 4/1998 | Akram et al. | 257/698 |
| 5,766,982 A | * | 6/1998 | Akram et al. | 438/117 |
| 5,808,873 A | * | 9/1998 | Celaya et al. | 257/676 |
| 5,831,832 A | * | 11/1998 | Gillette et al. | 361/760 |
| 5,834,835 A | * | 11/1998 | Maekawa | 257/680 |
| 5,895,965 A | * | 4/1999 | Tanaka et al. | 257/668 |
| 5,909,056 A | * | 6/1999 | Mertol | 257/704 |
| 5,963,429 A | * | 10/1999 | Chen | 257/686 |
| 6,046,077 A | * | 4/2000 | Baba | 438/127 |
| 6,049,094 A | * | 4/2000 | Penry | 257/99 |
| 6,071,761 A | * | 6/2000 | Jacobs | 438/127 |
| 6,197,614 B1 | * | 3/2001 | Ho | 438/108 |
| 6,248,951 B1 | * | 6/2001 | Murali et al. | 174/52.2 |
| 6,359,335 B1 | * | 3/2002 | Distefano et al. | 257/684 |
| 6,472,598 B1 | * | 10/2002 | Glenn | 174/52.2 |
| 6,555,906 B2 | * | 4/2003 | Towle et al. | 257/723 |
| 2003/0038381 A1 | * | 2/2003 | Bolken | 257/787 |

FOREIGN PATENT DOCUMENTS

| | | | |
|---|---|---|---|
| JP | 63-62362 | * | 3/1988 |
| JP | 2-260650 | * | 10/1990 |
| JP | 11-354554 | * | 12/1999 |

* cited by examiner

Primary Examiner—David A. Zarneke
Assistant Examiner—Monica D. Harrison
(74) Attorney, Agent, or Firm—David T. Millers

(57) ABSTRACT

A flip-chip packaging method for a semiconductor device treats a portion of an interconnect substrate so that a fill material when liquid beads on the treated portion of the interconnect substrate. When the fill material is dispensed on the interconnect substrate to fill a gap under the semiconductor device, the beading of the fill material prevents formation of fillets that might otherwise create a variation in the thermal coefficient of expansion of fill material and/or warp the interconnect substrate. The treated portion of the interconnect substrate can be roughened or coated with a material that differs from other portions of the interconnect substrate and thereby causes beading.

6 Claims, 2 Drawing Sheets

FLIP-CHIP PACKAGING METHOD THAT TREATS AN INTERCONNECT SUBSTRATE TO CONTROL STRESS CREATED AT EDGES OF FILL MATERIAL

BACKGROUND OF INVENTION

Flip-chip packaging can generally provide a small footprint package with a large number of electric connections to an integrated circuit die.

FIG. 1A illustrates a packaged device 100 using flip-chip packaging of an integrated circuit die 110. Die 110 is an integrated circuit chip formed from a semiconductor wafer and having solder bumps 115 on an active surface. Solder bumps 115 are electrically connected to circuit elements formed in and on die 110. In packaged device 100, die 110 is flipped so that bumps 115 contact a substrate 130.

Substrate 130 is typically a printed circuit made of a material such as polyimide, polyimide alloy or compound or non alloy general polymer and metal composites; ceramic, silicon, or glass and metal composites; or similar materials forming a flexible or rigid carrier having conductive traces (not shown), which are generally made of copper or another metal. Solder bumps 115 on die 110 contact the conductive traces on the top surface of substrate 130, and the conductive traces, which extend through substrate 130, electrically connect solder bumps 115 to solder balls 135 on the bottom surface of substrate 130. Solder balls 135, which can be arranged in a ball grid array, form the terminals of packaged device 100 and can be attached to a printed circuit board or other circuitry in a product containing packaged device 100.

One concern in flip-chip packages is the difference between the coefficients of thermal expansion of semiconductor die 110 and substrate 130. This difference creates mechanical displacement stress on the connections between die 110 and substrate 130. In packaged device 100, underfill 120 between die 110 and substrate 130 strengthens the attachment of die 110 to substrate 130 to help prevent the thermal stresses from breaking the connections between die 110 and substrate 130.

FIG. 1B illustrates an edge of underfill 120. Underfill 120 contains filler particles 122 suspended in an organic resin 124. Filler particles 122 generally have a size selected according to a gap between die 110 and substrate 130, e.g., the filler particles have a diameter about one third the size of the gap. Generally, the composition and concentration of filler particles 122 are selected to control the coefficient of thermal expansion and the shrinkage of underfill 120.

Organic resin 124 that when initially applied in device 100 is a liquid that flows into the gap between die 110 and substrate 130. Accordingly, the edge of underfill 120 has a concave shape that depends on the viscosity of liquid organic resin 124 and the adhesion of organic resin 124 to die 110 and substrate 130. Organic resin 124 subsequently cures, and the presence of filler particles 122 helps control the shrinkage that occurs in underfill 120 during curing.

As shown in FIG. 1B, the distribution of filler particles 122 is relatively uniform where underfill 120 is significantly thicker than the diameter of filler particles 122. However, in fillet regions 126 and 128 where the thickness of underfill 120 approaches or is less than the diameter of a filler particle, the density of filler particles 122 falls or is reduced. The lack of filler particles 122 causes more shrinkage in fillet regions 126 and 128 during curing. This shrinkage can warp substrate 130 and disrupt electrical connections between substrate 130 and die 110 or between substrate 130 and an external circuit. In particular, shrinkage and surface tension in underfill 120 causes stress S on substrate 130 near the edge of die 110. This stress S is along a direction that depends on the wetting angle α of underfill 120 at the edge of die 110.

The lack of filler particles 122 in region 126 also makes the coefficient of thermal expansion of in regions 126 and 128 differ from the coefficient of thermal expansion in thicker regions of underfill 120. Accordingly, temperature changes can induce further stress in fillet regions 126 and 128 if the composition of underfill 120 is selected to minimize stress created by thermal expansion in thick regions of underfill 120.

To improve reliability and yield of good packages, methods and structures are sought that avoid increased shrinkage, stress that warps the substrate, and/or change in coefficient of thermal expansion that occurs at the edges of the underfill.

SUMMARY OF INVENTION

In accordance with an aspect of the invention, a dam, barrier, or other damming feature or discontinuity changes the shape or accumulation of the underfill material to reduce stress resulting from edge effects. In particular, the dam controls the wetting angle of the underfill material to provide a much smaller stress component perpendicular to the surface of the underlying substrate, and the underfill as shaped by the dam lacks underfill fillet regions that shrink significantly and cause stress on the substrate. The dammed underfill additionally avoids or reduces the size of areas having low filler particle concentration and thus avoids thermal coefficients of expansion that differ from the optimal coefficients. The resulting package has superior performance as defined by co-planarity, reliability, and mechanical improvement when compared to conventional overall flip-chip packages.

One specific embodiment of the invention is a packaged device that includes a substrate, a die, and a dam. The die has contacts placed as in a conventional flip-chip package so that the contacts electrically contact conductive traces of the substrate. The dam attaches to the substrate and surrounds the die to confine the edges of underfill that fills a gap between the die and the substrate. The dam controls the shape of the underfill so that wetting angles at the die and at the dam are less than 45° or so that the underfill lacks fillet regions.

Generally, the device has a ball grid array on a side of the substrate opposite to the die. In an exemplary embodiment, the ball grid array has a pitch that is less than or about equal to one half a separation between the dam and an edge of the die. The width of the dam is typically between one and two times the pitch of the ball grid array, and the height of the dam is chosen to provide a wetting angle for the underfill that avoids stress on the substrate or areas of underfill having a low filler concentration.

Another embodiment of the invention is a method for packaging an integrated circuit die. The method includes: attaching the die to a substrate so that conductive traces on the substrate electrically contact contacts on the die; forming a dam on the substrate around the die; and filling a volume between the die and the substrate and between the die and the dam with an underfill material. The dam can be constructed before applying the underfill by placing, depositing, growing, or otherwise accumulating material on the substrate to form the dam. Alternatively, the dam can be preformed to the desired shape and attached to the substrate. The underfill is applied after the dam is in place so that the dam controls the shape and location of the edge of the underfill. Suitable materials for such dams include but are not limited to a material such as a metal layer or feature and a polymer which is filled with property modifying materials such as spheres, fibers or pieces of quartz, ceramic, or metal.

In an alternative embodiment, removing material from the substrate (e.g., by machining or etching) before a die is attached can leave a dam surrounding a die attachment area on the substrate.

In yet another alternative embodiment, treatment of the substrate increases adhesion or stiction between the underfill and the substrate in specific areas on the substrate. The underfill accumulates and can be shaped and cured to form the dam in the treated area of the substrate.

BRIEF DESCRIPTION OF DRAWINGS

Use of the same reference symbols in different figures indicates similar or identical items.

DETAILED DESCRIPTION

In accordance with an aspect of the invention, a flip-chip package uses a dam surrounding a die to eliminate underfill fillets and control of underfill wetting angles. The dam thereby reduces warping of a substrate in the flip-chip packaged device.

Figure 1A:
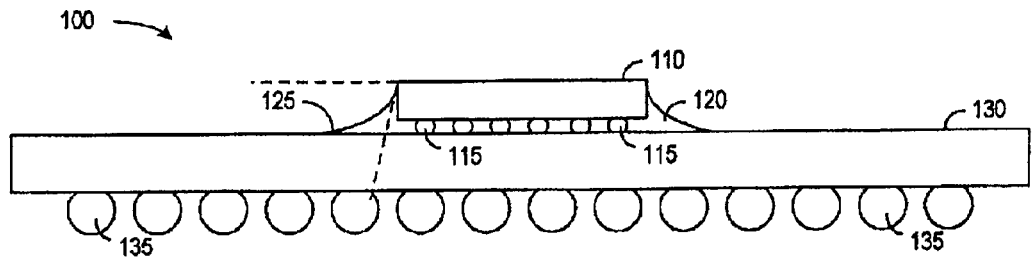
FIGS. 1A and 1B show cross-sectional views of a conventional flip-chip packaged device.
Figure 1B:
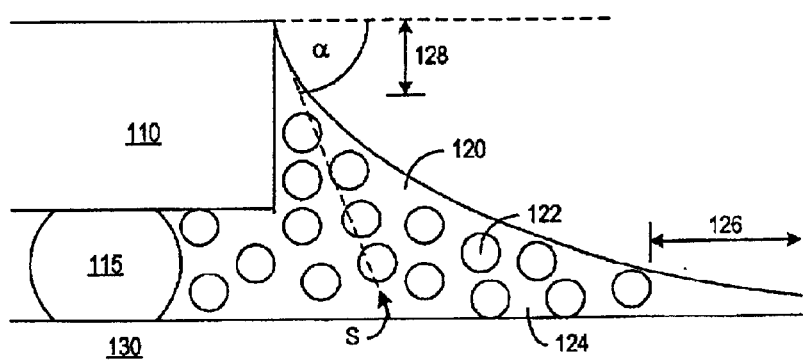
Figure 2A:
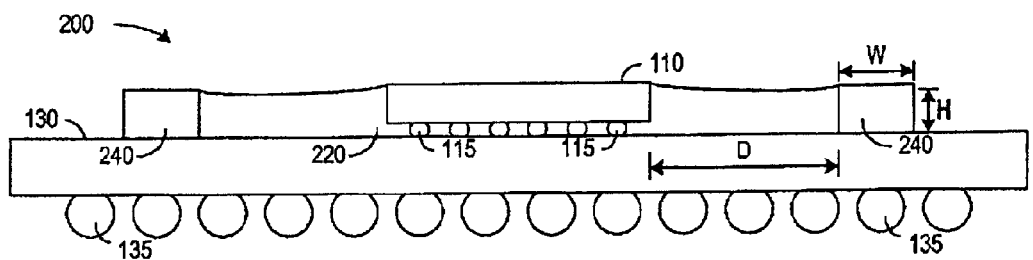
FIGS. 2A and 2B show cross-sectional views of a flip-chip packaged device in accordance with an embodiment of the invention that has an underfill dam surrounding a die on a substrate.

FIG. 2A illustrates a flip-chip packaged device 200 in accordance with an embodiment of the invention. Packaged device 200 contains an integrated circuit die 110 having contacts 115 connected to conductive traces (not shown) in and on a substrate 130. The conductive traces connect contacts 115 to external terminals (solder balls) 135 on substrate 130. Die 110, contacts 115, substrate 130, and external terminals 135 are generally conventional structures such as well known in the art and described above.

In accordance with an aspect of the invention, flip-chip packaged device 200 includes a dam 240 that surrounds die 110 and controls the shape of the edge of an underfill 220. Dam 240 can be formed of a variety of materials including but not limited to a dispensed organic isolative material such as benzotriazole (BT) or modified silicone, a thermo setting mold compound such as epoxy creasol novolac (ECN) or a modified BT, or a thermo plastic compound such as polyethyl sulfone (PES) polycarbonate or polysulfone, that is deposited and formed into the desired shape on substrate 130.

Dam 240 can be formed on or attached to substrate 230 using a variety of techniques. For example, suitable dam forming techniques include but are not limited to liquid dispense methods, injection transfer molding, and thermo-compression transfer molding. Alternatively, dam 240 can be a preformed organic or metallic structure that is formed into the desired shape and then attached to substrate 240 by gluing, staking, or riveting. In one particular embodiment, dam 240 doubles as a stiffener or heat spreader that attaches to substrate 130 to improve the mechanical or thermal properties of packaged device 200. Co-filed patent application Ser. No. 09/683,304, entitled "Adhesive Control During Stiffener Attachment To Provide Co-Planarity In Flip Chip Packages", further describes attachment of a stiffener and is hereby incorporated by reference in its entirety.

After formation or attachment of dam 240 on substrate 130, a measured amount of underfill is applied to flow under die 110 and fill a volume that dam 240 defines. Ideally, the volume of underfill and the height H, width W, and shape of dam 240 and the separation D between dam 240 and die 110 are set according to the natural flow of the organic underfill 220 and the cure schedule during fabrication of device 200. In particular, the volume of underfill and dam's height H, width W, and separation D should provide total filling of the volume under die 110, and the shape of underfill 220 in the area in and around the periphery of die 110 should lack fillet regions or steep wetting angles. In particular, to prevent the creation of stress concentrations, the height H of dam 240 is selected to prevent the creation of any sharp angles or areas of high shrinkage such as those resulting from the formation of underfill fillets.

Figure 2B:
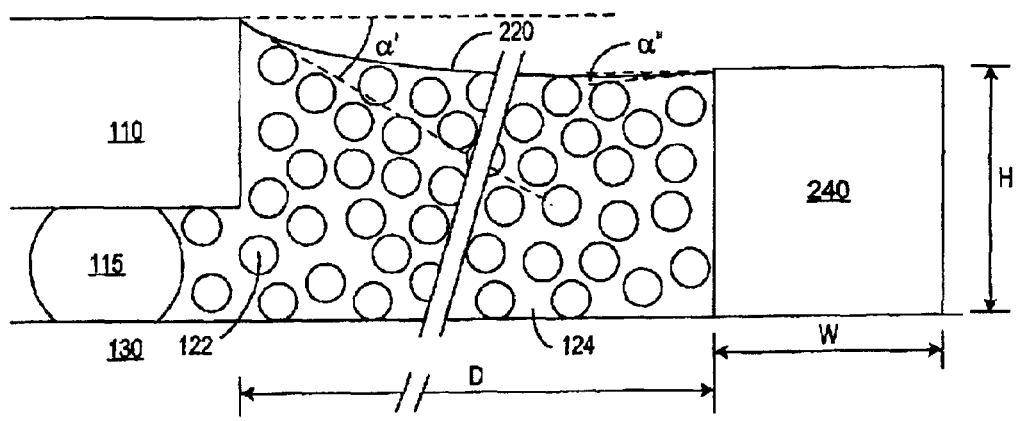

Generally, the volume of underfill and the height and shape of dam 240 should be selected to ensure that a wetting angle $\alpha'$ of underfill 220 is less than 45° (maximum) from the top surface of die 110 as shown in FIG. 2B. The underfill wetting angle $\alpha''$ to dam 240 should also be less than 45°, thereby ensuring a complete and balanced stress spreader of underfill. Additionally, each region of underfill 220 should be thick enough to ensure minimum shrinkage and maximum retention of the bulk fill allowing creation of the best case material performance and easiest methodology of underfill process across the space between the edge of die 110 and dam 240.

The shape for dam 240 will depend on the particular underfill used since commercially available underfills have different flows, viscosities, and curing schedules. However, for any particular underfill, empirical or analytic techniques can find a height and width of dam 240 that provides the desired performance. Table 1 illustrates some exemplary dam and fill configurations and the wetting angles achieved. Each of the examples of Table 1 uses 82 mg of underfill and 50 mg of dam material. A die back temperature of 90° is used with Hysol 4549 as underfill, and a die back temperature of is 130° is used with Namics 8444-3 or CRP4152R-2 as underfill.

TABLE 1

Dam & Fill Structure and Underfill Wetting Angle

| Dispensing Gap (mil) | Underfill Material | Dam Material | Dam Height (mm) | Dam Width (mm) | Dam to Die Distance (mm) | Wetting Angle |
|---|---|---|---|---|---|---|
| 17 | Hysol 4549 | Hysol 4155 | 0.26899 | 1.00601 | 1.53801 | 32° |
| 14 | Hysol 4549 | Hysol 4155 | 0.28899 | 0.94801 | 1.57101 | 30° |
| 10 | Hysol 4549 | Hysol 4155 | 0.27699 | 1.12001 | 1.61701 | 29° |
| 17 | Namics 8444-3 | CRP3600H | 0.36598 | 0.74200 | 1.71901 | 6° |

TABLE 1-continued

Dam & Fill Structure and Underfill Wetting Angle

| Dispensing Gap (mil) | Underfill Material | Dam Material | Dam Height (mm) | Dam Width (mm) | Dam to Die Distance (mm) | Wetting Angle |
|---|---|---|---|---|---|---|
| 14 | Namics 8444-3 | CRP3600H | 0.34798 | 0.78700 | 1.72101 | 4° |
| 10 | Namics 8444-3 | CRP3600H | 0.27399 | 0.88990 | 1.74001 | 9° |
| 17 | CRP4152-R | CRP3600H | 0.41900 | 0.8500 | 1.58801 | 14° |
| 14 | CRP4152-R | CRP3600H | 0.31199 | 0.94401 | 1.55101 | 16° |
| 10 | CRP4152-R | CRP3600H | 0.24699 | 1.00901 | 1.60801 | 16° |

In an exemplary embodiment of the invention, the distance D of dam 240 from the die edge of die 110 is at least of twice the pitch of the ball grid array (BGA) containing solder balls 135. A separation greater than twice the BGA pitch ensures that stress in underfill 220 will be spread over multiple solder balls 135, and no stress concentration is within one BGA pitch.

The natural performance of dam 240 is maximized when the width W of dam 240 is no less than one BGA ball pitches width. Following these rules, a high aspect ratio of silicon to package preferably keeps dam 240 a distance of at least 2 mm from the edge of die 110 and does not allow dam 240 or underfill 220 to overflow or exceed the edge of body package outline.

Figure 3:
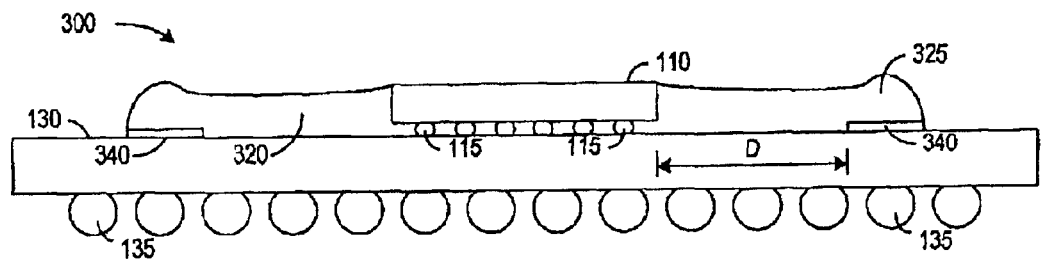
FIG. 3 shows a cross-sectional view of a flip-chip packaged device in accordance with an embodiment of the invention in which a substrate includes a treated region on which an underfill forms a dam.

FIG. 3 illustrates a flip-chip packaged device 400 in accordance with an embodiment of the invention in which substrate 230 has a treated region 340. Treated region 340 has a high affinity to or stiction with underfill and can be made of a material such as a polymer, metal, ceramic, or combination thereof or can be formed by a surface roughening or preparation technique designed to increase surface area contact, which may hinder or control the flow characteristics of the underfill due to increased surface tension. When dispensing liquid underfill inside the perimeter of treated region 340, the outward flow of the liquid underfill forms a bead 325 over treated regions 340. Treated region 340 thus acts as a dam to limit the flow of underfill 320 and shape underfill 320 to avoid thin fillet regions that cause stress and warping in substrate 130. Curing underfill 320 preserves the shape of underfill 320 as controlled by treated region 340.

Figure 4:
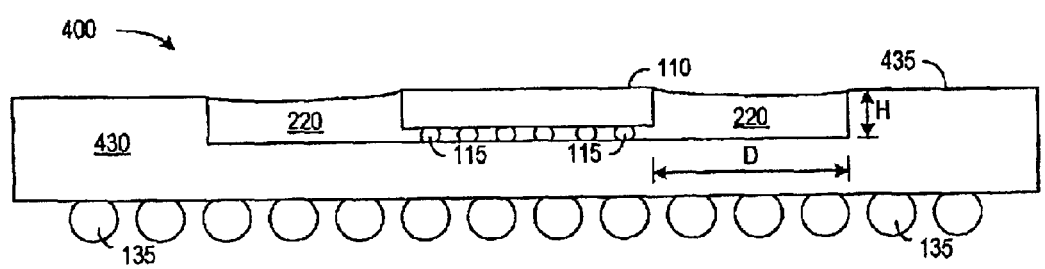
FIG. 4 shows a cross-sectional view of a flip-chip packaged device in accordance with an embodiment of the invention in which a substrate includes a depression for a die and has a dam surrounding the die.

FIG. 4 illustrates a flip-chip packaged device 400 in accordance with yet another alternative embodiment of the invention. Device 400 includes a substrate 430 having a depression in which die 110 resides. Machining, etching, or another material removal process can form the depression in substrate 430 before die 110 is attached. After attaching die 110 to metal traces in the depression of substrate 430, a surrounding portion 435 of substrate 430 forms a dam that shapes and contains underfill 220 to avoid stress and warping that edge effects in underfill 220 could otherwise cause.

As noted herein, a dam shapes the edge of an underfill structure in a flip-chip package to reduce stress concentrated around the edge of the die. The resulting flip-chip package has superior planarity of the substrate for better connections of the BGA, superior reliability by avoiding inhomogeneity in the coefficient of thermal expansion and associated stress during thermal cycling, and better mechanical attachment of the die and substrate when compared to conventional flip-chip packages.

Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. A method for packaging an integrated circuit die, comprising:

attaching the die to a substrate so that metal bumps on the die contact conductive traces on a face of the substrate;

treating the face of the substrate so that a fill material when liquid has a higher affinity for a first portion of the substrate and a lower affinity for a second portion of the substrate, wherein the first portion surrounds an area where the die attaches to the substrate and the second portion surrounds the first portion; and dispensing the fill material as a liquid to fill a gap between the die and the substrate, wherein the fill material flows onto the first portion of the substrate, and the higher affinity of the first portion causes the fill material to bead on the first portion of the substrate.

2. The method of claim 1, wherein treating the face of the substrate comprises forming a region of a material on the first portion of the substrate.

3. The method of claim 2, wherein the material comprises a substance selected from the group consisting of polymers, metals, ceramics, and combination thereof.

4. The method of claim 1, wherein treating the face of the substrate comprises roughening the first portion of the substrate.

5. The method of claim 1, further comprising curing the fill material to preserve a shape of the fill material including a bead on the first portion.

6. The method of claim 1, wherein beading of the liquid fill material on the first portion of the substrate prevents formation of thin fillet regions of the fill material.

* * * * *